United States Patent
Cotte et al.

(10) Patent No.: US 7,808,798 B2
(45) Date of Patent: Oct. 5, 2010

(54) VERSATILE SI-BASED PACKAGING WITH INTEGRATED PASSIVE COMPONENTS FOR MMWAVE APPLICATIONS

(75) Inventors: John Michael Cotte, New Fairfield, CT (US); Brian Paul Gaucher, New Milford, CT (US); Janusz Grzyb, Pfaffikon (CH); Nils Deneke Hoivik, Pleasantville, NY (US); Christopher Vincent Jahnes, Upper Saddle River, NJ (US); John Ulrich Knickerbocker, Monroe, NY (US); Duixian Liu, Scarsdale, NY (US); John Harold Magerlein, Yorktown Heights, NY (US); Chirag Suryakant Patel, Peekskill, NY (US); Ullrich R. Pfeiffer, Yorktown Heights, NY (US); Cornelia Kang-I Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/062,665

(22) Filed: Apr. 4, 2008

(65) Prior Publication Data
US 2008/0186247 A1 Aug. 7, 2008

Related U.S. Application Data

(63) Continuation of application No. 11/498,689, filed on Aug. 3, 2006, now Pat. No. 7,518,229.

(51) Int. Cl.
*H05K 1/18* (2006.01)

(52) U.S. Cl. ...................................... 361/763; 361/760

(58) Field of Classification Search .......... 343/700 MS, 343/701, 767, 841; 257/416, 245, 698, 685, 257/723, 728, E25.005, E25.01, E25; 361/760, 361/763, 784; 29/600; 438/106
See application file for complete search history.

(56) References Cited

U.S. PATENT DOCUMENTS

| 5,241,456 A | * | 8/1993 | Marcinkiewicz et al. | ..... 361/792 |
| 7,479,685 B2 | * | 1/2009 | Fazzio et al. | ................ 257/416 |
| 2006/0001572 A1 | * | 1/2006 | Gaucher et al. | ............ 343/701 |

(Continued)

OTHER PUBLICATIONS

Tilmans et al., MEMS for wireless communications: "from RF-MEMS components to RF-MEMS-SiP", Journal of Micromechanics and Microengineering, 13(2003)S139-S163.*

*Primary Examiner*—Jinhee J Lee
*Assistant Examiner*—Yuriy Semenenko
(74) *Attorney, Agent, or Firm*—McGinn IP Law Group PLLC; Louis J. Percello, Esq.

(57) ABSTRACT

An apparatus is described incorporating an interposer having a cavity for a portion of an antenna structure, having conductor through vias, a top Si part having interconnection wiring and having pads for electrically mounting an integrated circuit chip thereon, wherein the top Si part mates with the interposer electrically and mechanically. The interposer and top Si part may be scaled to provide an array of functional units. The invention overcomes the problem of combining a high efficient antenna with integrated circuit chips in a Si package with signal frequencies from 1 to 100 GHz and the problem of shielding components proximate to the antenna and reduces strain arising from mismatching of TCEs.

14 Claims, 5 Drawing Sheets

U.S. PATENT DOCUMENTS

2007/0026567 A1* 2/2007 Beer et al. .................. 438/106
2008/0238793 A1* 10/2008 Channabasappa ........... 343/767
2009/0015485 A1* 1/2009 Floyd et al. ........... 343/700 MS

* cited by examiner

VERSATILE SI-BASED PACKAGING WITH INTEGRATED PASSIVE COMPONENTS FOR MMWAVE APPLICATIONS

The present application is a Continuation Application of U.S. patent application Ser. No. 11/498,689 filed on Aug. 3, 2006, now U.S. Pat. No. 7,518,229.

FIELD OF THE INVENTION

This invention relates to a Si-based packaging process, specifically targeted for high frequency applications, wherein a protected RFIC (radio frequency integrated circuit) chip, thru-vias for I/O signals, an antenna and required RF passives (resistors, capacitors, inductors, filters, switches etc) can all be combined into one module or at one location in an array having a common Si interposer.

BACKGROUND

With the continuing trend in the wireless electronic industry towards miniaturization, the performance, size, and cost of millimeter wave (mmWave) systems are often limited by the packaging technology chosen. The packaging approach selected must both offer mechanical support and electrically connect the various microwave components. Critical components include RFIC chips, high-efficiency antennas, transmission lines, capacitors, inductors, resistors, MEMS devices, and various types of filters. RFIC chips are fabricated using various semiconductor technologies such as Si, GaAs, CMOS or SiGe can be attached within the packages.

The packaging approach for mmWave transceiver applications operating from 1 to 100 GHz needs to incorporate an antenna to fully function as a radio. Currently, the greatest challenge for integrating any antenna structure into a suitable package is to ensure proper antenna efficiency. Materials, such as Si is traditionally avoided, or used with caution at high frequencies due to the interference with antenna performance. The only option has traditionally been to use highly complex and costly packaging technologies, or expensive low-temperature co-fired ceramic (LTCC) substrates. Recently potentially low cost plastic packaging has been reported for single-chip solutions, however, the packaging method is difficult to use for mass production. In addition, phased arrays, used for beam steering, and focal plane imaging arrays require a multitude of pixels (each represented by an antenna) that demand low-cost wafer level integration of mmWave RFIC chips, RF passive components and antennas.

A variety of approaches have been proposed to create so-called systems-in-a-package (SiP) containing required RFIC chips, shielding and passive components for the given RF application, where the most frequent approach is to simply combine discrete devices onto a common substrate. This is what's known as a RF SiP where a single package system/sub-system integrates one or more ICs (or RFICs) and/or embedded passive components. Some typical applications include transceiver SiP, full radio SiP, FEM (Front End Module), ASM (Antenna Switch Module), and PAM (Power Amplifier Module). However, these applications have all in common individual devices that are not an integral part of the substrate and therefore need to be mounted or connected to a common substrate. This approach is very similar to what is known as Multi-Chip modules (MCM) in which several IC chips are connected together on a common custom-designed substrate containing interconnect layers.

Further, enhancements to multi-layered thin-film MCM substrates have demonstrated the inclusion of simple RF passives such as resistors, inductors and capacitors to be embedded within the interconnect layers. Such a substrate may then further serve as the basic building block to create a RF SiP where both active devices (RFIC chips) and discrete passive components (PIN diodes, varactor diodes etc) can be attached and assembled to the surface and connected using either wire or flip-chip bonding. Packaging in the form of RF-MEMs-SiP modules including passive components is described in a publication by J. A. C. Tilmans et al. entitled "MEMS for wireless communications:' from RF-MEMS components to RF-MEMS-SiP'" published in the Journal of Micromechanics and Microengineering, 13 (2003) S139-S163. Thus, as a packaging technology platform, SiP allows a high degree of flexibility in the package architecture, particularly for RF applications [3]. RF SiP packaging is described in a publication by J. Wu et al. entitled "RF SiP Technology: Integration and Innovation" Gaasmantech 2004. The greatest challenge to these packaging approaches (SiP and MCM) is the thermal mismatch between the various components attached to the common carrier substrate. Secondly, for high frequency applications the physical distance set between the active circuit and passive devices (such as the antenna) greatly challenge RF circuit optimization.

In order to integrate an antenna in a package, while simultaneously ensure proper antenna efficiency a relative complex packaging approach using an flip-chip mounted antenna in conjunction with the printed circuit board has been described in U.S. Patent Publication No. 20060001572 published Jan. 5, 2006. Although this approach demonstrates a possible avenue for automated assembly, the packaging approach does not leverage cost saving features from mass production approach. Furthermore, hermetic sealing of the components using this approach is challenging and not realistically viable

SUMMARY OF THE INVENTION

The invention provides an approach for creating a Silicon-based package with thru-vias for I/O signals, passive components and antenna together with a protected RFIC targeted for high frequency applications, all combined into one single module. Such a packaging approach may also comprise other passive devices such as RF-MEMS switches, inductors, fixed or variable capacitors while at the same time ensuring a minimum footprint. For devices which might require protection from the environment hermetic sealing of both the RFIC chip and MEMS devices is obtained using a metal-to-metal bond which takes place during the wafer bonding process.

The invention further provides an apparatus comprising an interposer comprising a substrate having an upper and lower surface, the upper surface having at least one cavity for forming a portion of an antenna structure, the interposer including conducting through vias from the upper surface to the lower surface, the conducting through vias at the lower surface adapted for coupling to a source of electrical signals and a voltage supply, a top Si part having interconnection wiring on a lower surface and having first pads for electrically mounting an integrated circuit chip thereon, the top Si part having second pads on the lower surface mating with a plurality of conducting through vias at the upper surface of the interposer, and having an antenna positioned over the cavity for forming the antenna structure at times the top Si part is mated with the interposer.

The invention further provides an improved packaging for mmWave systems employing RF passives and integrated antennas fabricated using conventional IC fabrication or surface micromachining.

The invention further provides for the transfer of RF passives from the RFIC chip into a package with multiple options for interconnect technology flexibility.

The invention further provides for an all-Si approach to significantly aid in overcoming TCE mismatch problems which typically exist between RFIC chips and the packaging materials utilized

BRIEF DESCRIPTION OF DRAWINGS

These and other features, objects, and advantages of the present invention will become apparent upon consideration of the following detailed description of the invention when read in conjunction with the drawing in which.

DETAILED DESCRIPTION

Figure 1:
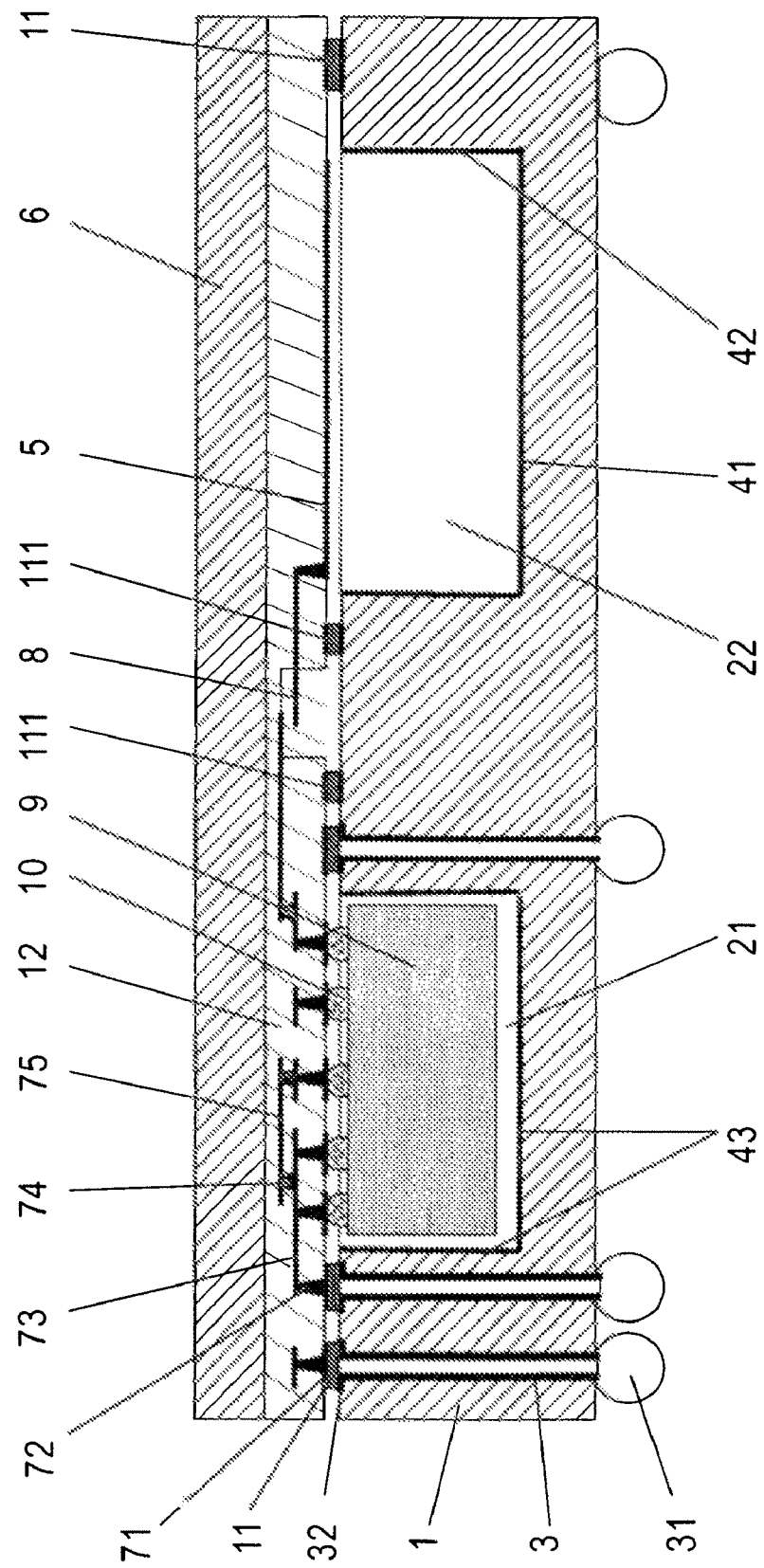
FIG. 1 is a cross section view of a complete low-profile Si-based package containing a RFIC, integrated MEMS transmit/receive switch, and antenna. The drawing is not to scale.

In the first embodiment of this invention two, or more, parts fabricated from Silicon which contains an RFIC chip, RFIC chip cavity, an antenna cavity, thru-vias, an antenna and passive devices created using micromachining techniques are combined into one package. These two parts will then be bonded together to create an all-inclusive Si-based mmWave package as illustrated in FIG. 1. The lower part of the package consists of an interposer 1 fabricated from Si with etched cavities for the RFIC chip 21 and antenna structure 22 as well as thru-vias 3 for external I/O connections such as supply and control voltage etc. To ensure proper antenna efficiency and desired performance the cavity below the antenna is metal coated 41. The metal coated in the bottom of the cavity functions to reflect the antenna radiation back to the antenna structure 22, while the metal coated cavity walls 42 ensure the radiated signal does not propagate into the Si substrate 1 effectively reducing the electro-magnetic radiation to other active components and improving antenna structure 22 efficiency as well. Similarly, the cavity for the RFIC chip 21 may be metal coated 43 to facilitate shielding. Depending on the intended application, an antenna 5 system as simple as a folded dipole or as complicated as a phased antenna array can be used. For printed circuit board attach, either C4 or BGA pads 31 are used in conjunction with the thru-vias 3. Interposer 1 may have a thickness in the range from 450 to 500 micrometers. Thru-vias 3 may be annular comprising Cu or W and may have a diameter in the range from 125 to 175 micrometers with 150 micrometers preferred. Metal coating 41 and 43 may be Cu. The assembled package (interposer 1 and Top Si part 6) and antenna structure may operate with frequencies in the range from 1 to 100 GHz and preferably in the range from 30 to 100 GHz. In addition to Si material for interposer 1 and top Si part 6, quartz material may be used.

Top Si part 6 contains the interconnect wiring 71-74, MEMS devices 8, and antenna 5 either inlaid or fabricated on top of the dielectric 12. Top Si part may be a thinned Si substrate having a thickness in the range from 150 to 450 micrometers. Interconnect wiring 71-74 and/or dielectric 12 may have a thickness in the range from 5 to 10 micrometers. Interconnect wiring 71-74 may be made in the same manner as Integrated circuit chip wiring or back end of the line (BEOL) wiring formed on chips. In most RF applications, it may be desirable to use high-resistivity Si for the top Si part 6 so as to improve antenna radiation and reduce losses associated with electromagnetic radiation dissipating into a conductive Si layer. Prior to bonding of the two Si parts, 1 and 6, the RFIC chip 9 is flip-chip bonded to the top part using either conventional C4 bump attach or using microbumps 10. If desired, combined hermetic sealing of both the RFIC chip 9 and MEMS devices 8 may be obtained using a seal ring consisting of the same bonding metallurgy 11 as the metal used for the bonding pads 32, which is used for the signal to propagate from the thru-vias 3 to the bonding pad 71 on top Si part 6. If only the MEMS devices 8 require hermetic sealing, a separate bonding, or seal-ring 111 may be used comprising gold tin, for example.

FIG. 1 may be reproduced side by side to show an array of bonded interposers and top Si parts where interposer 1 is common throughout the array and to Si part 6 is common throughout the array. The array would then have a plurality of cavities for forming respective portions of a plurality of antenna structures, a plurality of antennas, a plurality of integrated circuit chips (RF-ICs), and a plurality of interconnection wiring.

Figure 2:
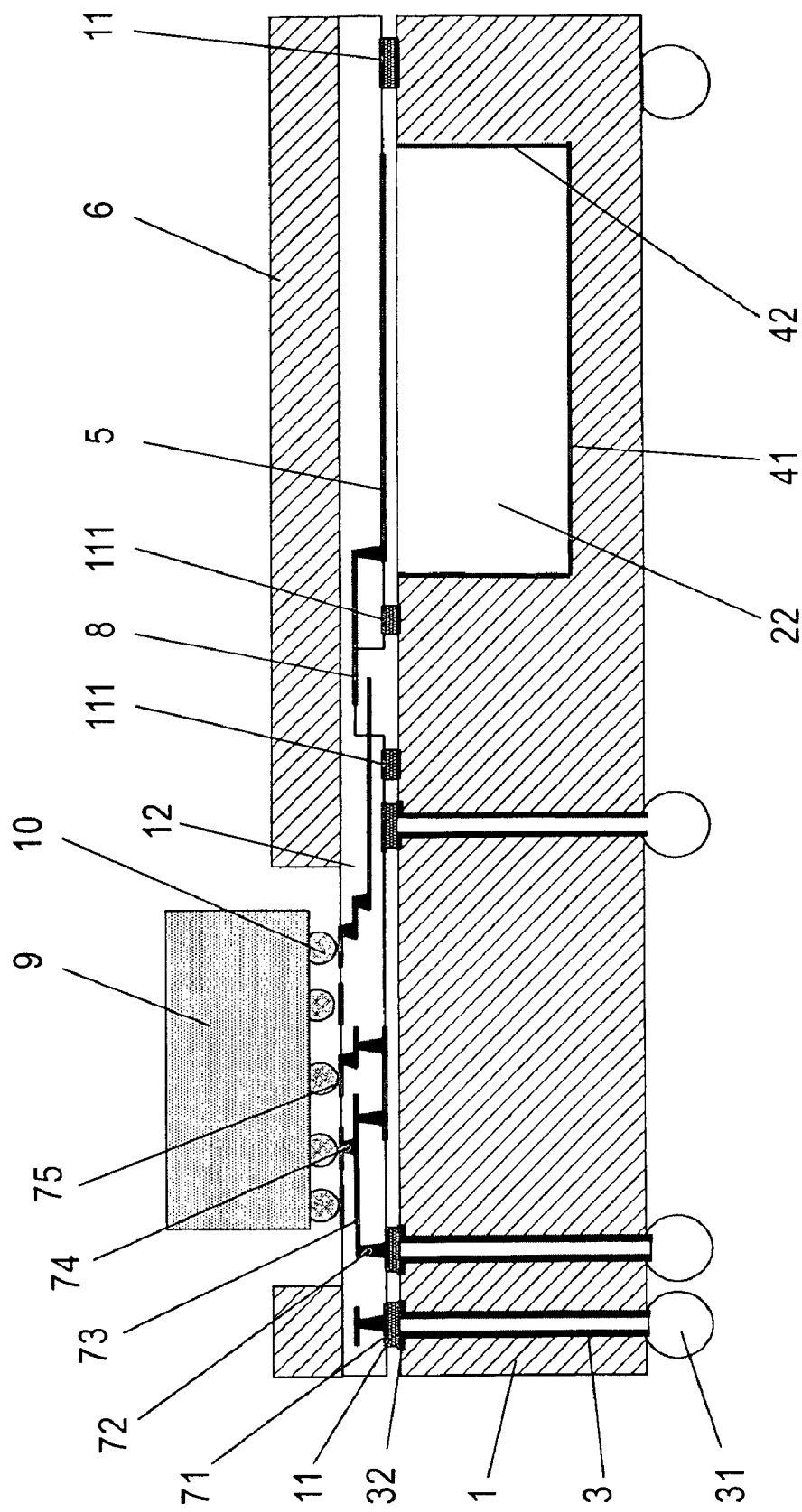
FIG. 2 is a cross section view of a complete Si-based package containing a RFIC, integrated MEMS transmit/receive switch, and antenna in which the RFIC chip is not contained within the package. Such an approach could allow for high power RFIC devices to be cooled using external cooling methods. The drawing is not to scale.

In a second embodiment, as illustrated in FIG. 2, the RFIC 9 chip is not embedded into a cavity in the Si interposer 1, rather it is bonded to the interconnect layers 75 on the back surface of top Si part 6. Such an approach could be useful for high power applications where the RFIC might require additional cooling.

Figure 3A:
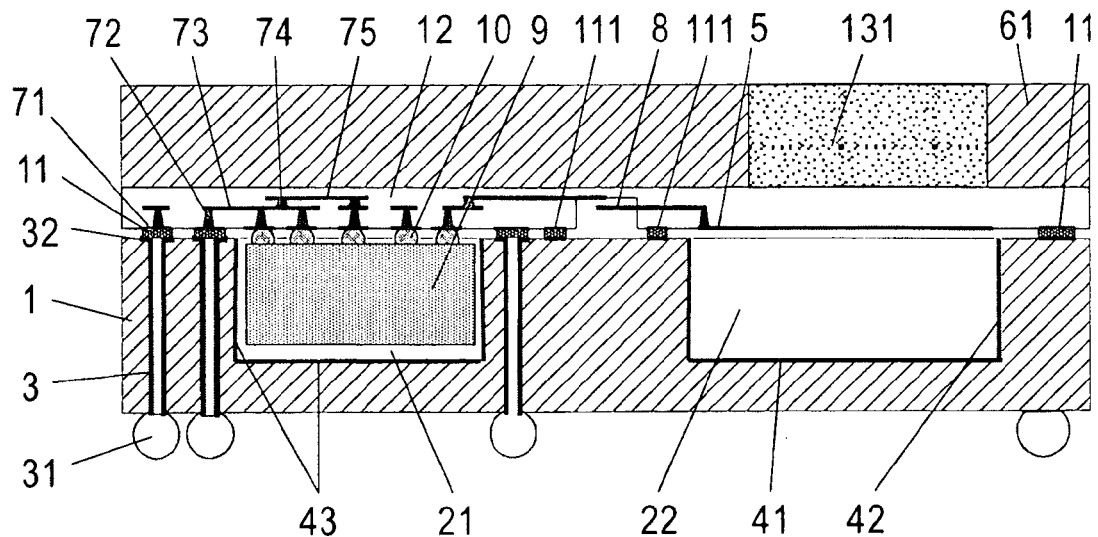
FIG. 3A is a cross section view of a Si-based package in which the region/area above the antenna is backfilled with a suitable material, different from Si, with desirable RF properties. This would allow the use of a thicker antenna substrate, which would be mechanically more robust.

In yet another embodiment, as illustrated in FIG. 3A, a thicker conventional non high-resistivity top Si part or substrate 61 may be used and may include a dielectric material 131 suitable to ensure and enhance proper antenna performance.

Figure 3B:
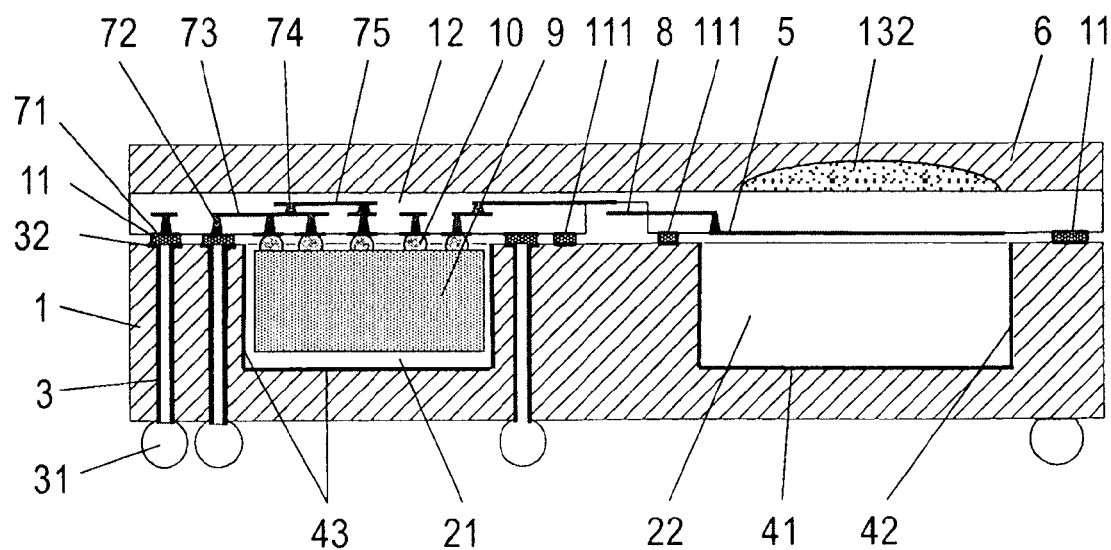
FIG. 3B is a cross section view of a Si-based package in which the region/area above the antenna is backfilled with a suitable dielectric material to create a lens above the antenna.

FIG. 3B illustrates a top Si part or substrate 6 which contains a lens-like inlaid dielectric (132) used to focus the antenna signal propagation.

Figure 4A:
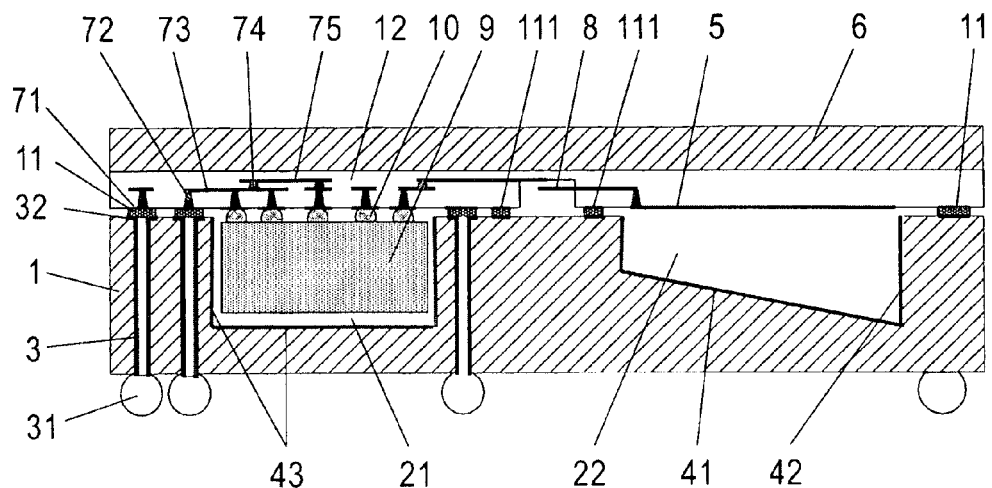
FIG. 4A a cross section view of a Si-based package with a shaped reflector with a desired geometry used to angle the direction of propagated antenna signal.
Figure 4B:
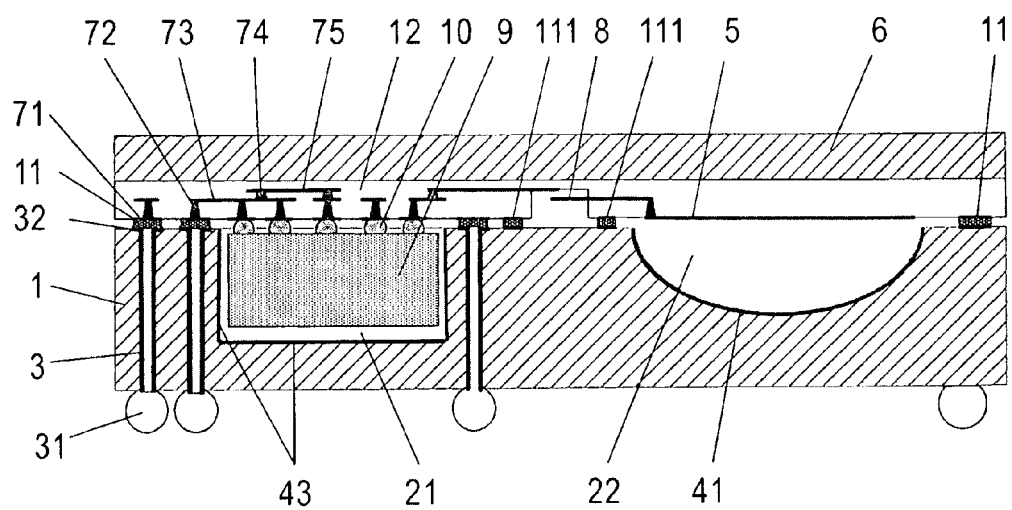
FIG. 4B is a cross section view of a Si-based package with a shaped antenna reflector used to focus antenna propagation signal.

In yet another embodiment, the antenna structure 22 has a reflector cavity shaped as illustrated in FIG. 4A. The reflector cavity has a flat bottom surface tilted at an angle transverse to interposer 1 upper surface to direct the antenna propagation signal. In FIG. 4B, the cavity has a concave bottom surface with respect to interposer 1 upper surface to focus the antenna signal energy.

Figure 5A:
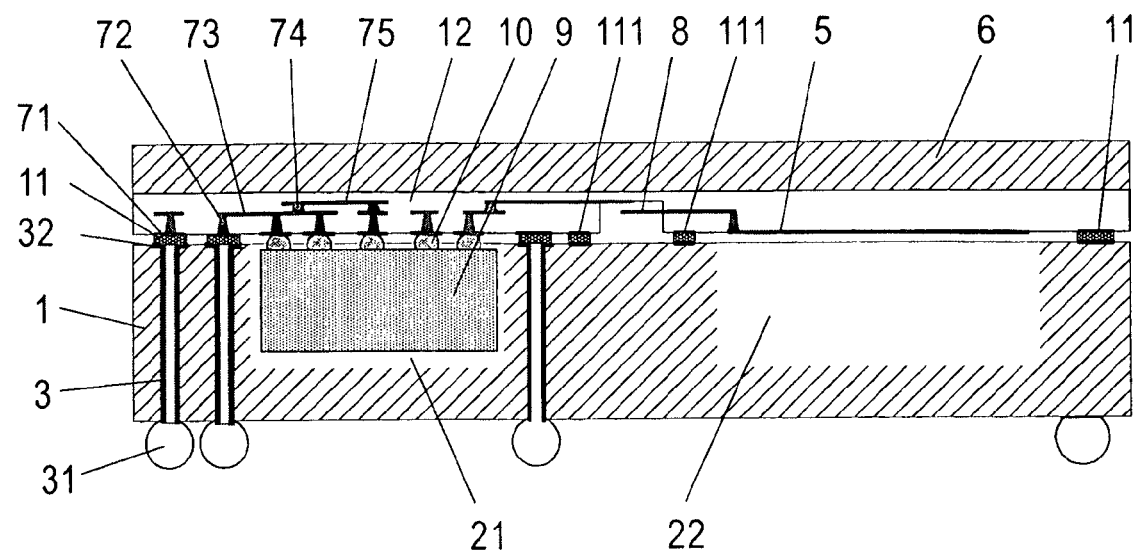
FIG. 5A is a cross section view of a Si-based package with an edge-launched antenna structure. This approach does not require a reflector in the bottom of the antenna cavity.
Figure 5B:
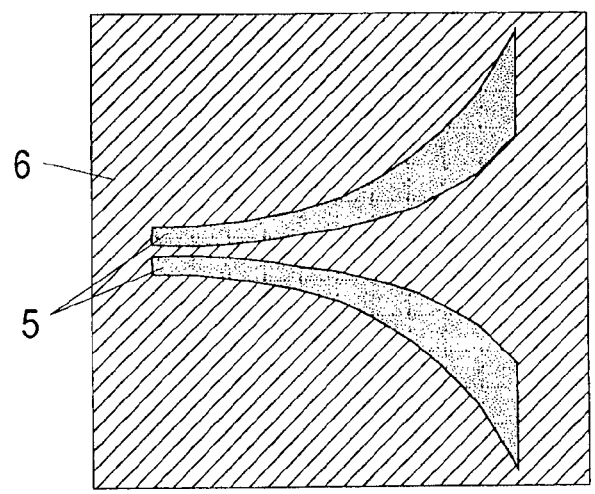
FIG. 5B is a top-view of an edge-launched antenna structure shown in FIG. 5A.

FIGS. 5A and 5B illustrates another embodiment in where an edge-launched antenna structure (5) is used.

While the examples described only illustrates a MEMS switch and antenna combined in an hermetic package, this Si-based packaging approach can further include nearly any desired set of passive components commonly used at RF frequencies (1-100 GHz). For example, other applications might include large, or small value, decoupling/bypass capacitors, inductors with high Q-factors and large inductance values, resistors, resonators and filters (micromachined, piezoelectric, cavity, or LC) and high-performance interconnects may all be integrated within the Si package. Active RFIC chips fabricated using various semiconductor technologies can be attached to the package.

Another benefit of this approach compared to conventional packaging methods is that thermal expansion mismatch stresses are avoided since most, or all, components are fabricated from Si. Secondly, using integrated circuit (IC) processing techniques together with Si micromachining allow for fabrication of RF passives with far tighter design tolerances compared to devices constructed using low-temperature co-fired ceramic (LTCC) substrate, PCB or other plastic packaging technologies.

While there has been described and illustrated a Si-based package containing an RFIC chip, interconnection wiring, through vias, MEMS devices, and an antenna, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. An apparatus comprising:
    an interposer comprising a substrate having an upper and lower surface, said upper surface having a plurality of cavities etched into said upper surface, said interposer including conducting through vias from said upper surface to said lower surface, said conducting through vias at said lower surface adapted for coupling to a source of electrical signals and a voltage supply,
    a radio frequency integrated circuit chip disposed within a first of the plurality of cavities;
    a top Si part having interconnection wiring on a lower surface and having first mounting devices for electrically mounting the radio frequency integrated circuit chip thereon,
    said top Si part having second mounting devices on said lower surface mating with a plurality of conducting through vias at said upper surface of said interposer, and having an antenna positioned over a second of the plurality of cavities.

2. The apparatus of claim 1, wherein said interposer and said top Si part are bonded together to form a perimeter seal around at least said radio frequency integrated circuit chip.

3. The apparatus of claim 1, wherein the first of the plurality of cavities has a bottom surface coated with a conductor.

4. The apparatus of claim 1, wherein the first of the plurality of cavities has a bottom surface and a plurality of sidewalls coated with a conductor.

5. The apparatus of claim 1, further including a mirco electro mechanical (MEMs) device positioned on said top Si part and coupled between said radio frequency integrated circuit chip and said antenna structure.

6. The apparatus of claim 1, wherein said radio frequency integrated circuit chip has rf electrical signals with frequencies in the range from 1 to 100 GHz.

7. The apparatus of claim 1, wherein said interposer is selected from the group consisting of Si and quartz.

8. The apparatus of claim 7, wherein said top Si part is selected from the group consisting of Si and quartz whereby a thermal coefficient of expansion of said top Si part matches a thermal coefficient of expansion of said interposer.

9. The apparatus of claim 1, wherein said antenna comprises two spaced apart electrodes increasing in space therebetween from one end to the other to provide antenna signal propagation away from said spaced apart electrodes where said spacing is greatest in the plane of said electrodes.

10. The apparatus of claim 2, wherein said perimeter seal is a metal to metal hermetic seal.

11. The apparatus of claim 10, wherein said perimeter seal extends around the edge of said upper surface of said interposer.

12. The apparatus of claim 1, wherein said interconnection wiring comprises a plurality of layers, said layers comprised of dielectric and metal conductors, said layers spaced apart and interconnected by vias.

13. The apparatus according to claim 1, wherein the integrated circuit chip comprises a flip-chip mounted integrated circuit.

14. The apparatus according to claim 1, wherein each of the plurality of cavities is coated with a metal.

* * * * *